(12) United States Patent
Long (10) Patent No.: US 9,859,307 B2
(45) Date of Patent: Jan. 2, 2018

(54) DISPLAY PANEL AND MANUFACTURING METHOD FOR THE SAME

(71) Applicant: Shenzhen China Star Optoelectronics Technology Co., Ltd., Shenzhen, Guangdong (CN)

(72) Inventor: Fen Long, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 85 days.

(21) Appl. No.: 14/907,247

(22) PCT Filed: Dec. 28, 2015

(86) PCT No.: PCT/CN2015/099123
§ 371 (c)(1),
(2) Date: Jan. 22, 2016

(87) PCT Pub. No.: WO2017/071054
PCT Pub. Date: May 4, 2017

(65) Prior Publication Data
US 2017/0236847 A1    Aug. 17, 2017

(30) Foreign Application Priority Data
Oct. 27, 2015  (CN) .......................... 2015 1 0708800

(51) Int. Cl.
*H01L 27/00* (2006.01)
*H01L 21/00* (2006.01)
(Continued)

(52) U.S. Cl.
CPC ...... *H01L 27/1248* (2013.01); *H01L 27/1255* (2013.01); *H01L 27/1262* (2013.01); *H01L 27/1288* (2013.01); *H01L 21/31058* (2013.01)

(58) Field of Classification Search
CPC ............. H01L 27/1248; H01L 27/1255; H01L 27/1262; H01L 27/1288; H01L 21/7865; H01L 21/31058; H01L 21/76877
See application file for complete search history.

(56) References Cited

U.S. PATENT DOCUMENTS

| | | | | |
|---|---|---|---|---|
| 5,905,548 A | * | 5/1999 | Shimada | G02F 1/136213 257/E27.111 |
| 7,335,450 B2 | * | 2/2008 | Sun | G02B 5/22 349/106 |

(Continued)

*Primary Examiner* — Nikolay Yushin
(74) *Attorney, Agent, or Firm* — Andrew C. Cheng (57) ABSTRACT

A display panel and manufacturing method. The method includes: forming a source electrode, a drain electrode and a channel on a substrate; depositing a first insulation layer; forming multiple color photoresists on the first insulation layer, and the source electrode, the drain electrode and the channel are located between two adjacent color photoresists; forming a gate electrode and a common electrode by a same process, and the gate electrode is located on the first insulation layer, and the common electrode is located on the photoresist; forming a second insulation layer having a through hole communicated with the source electrode on the gate electrode and the common electrode; forming a pixel electrode on the second insulation layer. The pixel electrode contacts with the source electrode through the through hole, and a storage capacitor is formed. The storage capacitor can be increased and the current leakage of the pixel electrode improved.

7 Claims, 6 Drawing Sheets (51) Int. Cl.
    *H01L 27/12*    (2006.01)
    *H01L 21/3105*  (2006.01)

(56) References Cited

U.S. PATENT DOCUMENTS

| | | | |
|---|---|---|---|
| 8,148,045 B2 * | 4/2012 | Murata | C07C 251/66 |
| | | | 430/270.1 |
| 9,269,827 B2 * | 2/2016 | Kao | H01L 29/78696 |
| 2005/0147899 A1 * | 7/2005 | Sun | G02B 5/22 |
| | | | 430/7 |
| 2010/0013785 A1 * | 1/2010 | Murai | G06F 3/047 |
| | | | 345/173 |

* cited by examiner

DISPLAY PANEL AND MANUFACTURING METHOD FOR THE SAME

BACKGROUND OF THE INVENTION

1. Field of the Invention

The present invention relates to a display technology field, and more particularly to a display panel and a manufacturing method for the same.

2. Description of Related Art

In the current display technology field, the COA (Color Filter on Array) is developed rapidly. The COA is a technology that manufactures color photoresist on a TFT substrate. Utilizing the COA technology, an alignment error between a pixel and the color photoresist will not be generated in order to decrease parasitic capacitance, and a display panel can have a better resolution and pixel aperture ratio.

Figure 1:
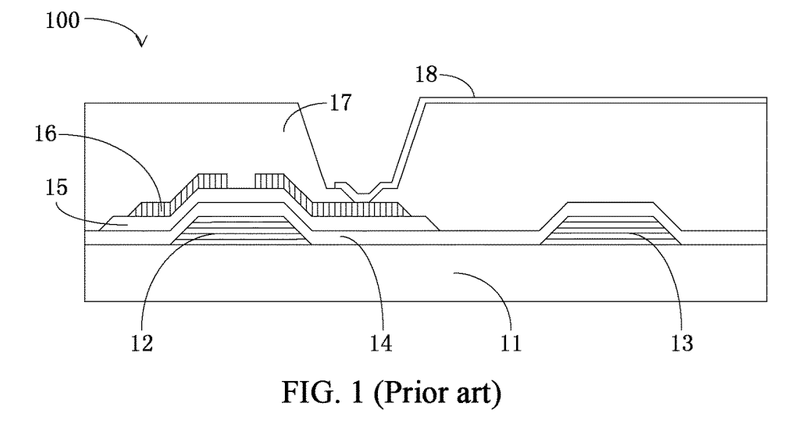
FIG. 1 is a schematic structure diagram of a display panel manufactured by a conventional COA technology.

With reference to FIG. 1, and FIG. 1 is a schematic structure diagram of a display panel manufactured by the current COA technology. The current technology sequentially forms a gate electrode 12, a common electrode 13, a first insulation layer 14, a channel 15, source electrode/drain electrode 16, color photoresist 17, and finally a pixel electrode 18 on a substrate 11. Wherein, the color photoresist increase a distance of electrode plates of a storage capacitor formed between the common electrode 13 and the pixel electrode 18 in order to case the storage capacitor of the display panel 100 is very small. However, the storage capacitor is used for maintaining a voltage of the pixel electrode 18 at a fixed value in a preset time. If the storage capacitor is too small, charges on the pixel electrode 18 for maintaining the voltage will leak rapidly such that the voltage on the pixel electrode 18 is decreased early so as to affect the display effect of the display panel 100.

SUMMARY OF THE INVENTION

The present invention mainly solves the technology of a distance between electrode plates of a storage capacitor in a display panel manufactured by COA technology is larger so that the pixel electrode is easily to leak current.

In order to solve the above technology problem, the present invention provides a manufacturing method for a display panel, and the method includes steps of: providing a substrate, and forming a source electrode and a drain electrode disposed at an interval on the substrate by a same process; forming a channel between the source electrode and the drain electrode such that the channel connects the source electrode and the drain electrode; depositing a first insulation layer on the substrate; forming multiple red photoresists, green photoresists and blue photoresists disposed at intervals on the first insulation layer, wherein, the multiple photoresists are arranged in a sequence of the red photoresist, the green photoresist and the blue photoresist, and the source electrode, the drain electrode and the channel are located between two adjacent photoresists; forming a gate electrode and a common electrode by a same process such that the gate electrode is located on the first insulation layer and between two adjacent photoresists, and the common electrode is located on the photoresist; forming a second insulation layer on the gate electrode and the common electrode, and the second insulation layer has a through hole communicated with the source electrode; and forming a pixel electrode on the second insulation layer, wherein the pixel electrode contacts with the source electrode through the through hole, and a storage capacitor is formed between the pixel electrode and the common electrode.

Wherein, before the step of forming a source electrode and a drain electrode disposed at an interval on the substrate by a same process further includes a step of: forming a black matrix on the substrate; the step of forming a source electrode and a drain electrode disposed at an interval on the substrate by a same process further includes a step of: forming the source electrode and the drain electrode disposed at an interval on the black matrix by the same process.

Wherein, the step of forming a source electrode, a drain electrode and the channel further includes: sequentially forming a semiconductor layer and a metal layer on the substrate; performing a photomask process to the metal layer in order to form the source electrode and the drain electrode, and to the semiconductor layer in order to form the channel.

In order to solve above technology problem, the present invention provides another manufacturing method for a display panel, and the method includes steps of: providing a substrate, and forming a source electrode, a drain electrode and a channel on the substrate; depositing a first insulation layer on the substrate; forming multiple color photoresists disposed at intervals on the first insulation layer, and the source electrode, the drain electrode and the channel are located between two adjacent color photoresists; forming a gate electrode and a common electrode by a same process such that the gate electrode is located on the first insulation layer, and the common electrode is located on the photoresist; forming a second insulation layer on the gate electrode and the common electrode, and the second insulation layer has a through hole communicated with the source electrode; and forming a pixel electrode on the second insulation layer, wherein the pixel electrode contacts with the source electrode through the through hole, and a storage capacitor is formed between the pixel electrode and the common electrode.

Wherein, the step of forming multiple color photoresists disposed at intervals includes steps of: forming multiple red photoresists, green photoresists and blue photoresists, and the multiple photoresists are arranged in a sequence of the red photoresist, the green photoresist and the blue photoresist.

Wherein, the step of forming a source electrode, a drain electrode and a channel on the substrate further includes: forming the source electrode and the drain electrode disposed at an interval on the substrate by a same process; forming the channel between the source electrode and the drain electrode such that the channel connects the source electrode and the drain electrode.

Wherein, before the step of forming the source electrode and the drain electrode disposed at an interval on the substrate by a same process further includes a step of: forming a black matrix on the substrate; the step of forming the source electrode and the drain electrode disposed at an interval on the substrate by a same process includes: forming the source electrode and the drain electrode disposed at an interval on the black matrix by the same process.

Wherein, the step of forming a source electrode, a drain electrode and a channel on the substrate further includes: sequentially forming a semiconductor layer and a metal layer on the substrate; and performing a photomask process to the metal layer in order to form the source electrode and the drain electrode, and to the semiconductor layer in order to form the channel.

In order to solve above technology problem, the present invention provides a display panel comprising: a substrate providing with a source electrode, a drain electrode and a channel, a first insulation layer, multiple color photoresists, a gate electrode, a common electrode, a second insulation layer and a pixel electrode; wherein, the first insulation layer is deposited on the substrate; the multiple color photoresists are formed on the first insulation layer, disposed at intervals, and the source electrode, the drain electrode and the channel are located between two adjacent color photoresists; the gate electrode and the common electrode are formed by a same process, the gate electrode is located on the first insulation layer and between two adjacent photoresists, and the common electrode is located on the photoresist; the second insulation layer is formed on the gate electrode and the common electrode, and the second insulation layer has a through hole communicated with the source electrode; and the pixel electrode is formed on the second insulation layer, wherein the pixel electrode contacts with the source electrode through the through hole, and a storage capacitor is formed between the pixel electrode and the common electrode.

Wherein, the color photoresists includes a red photoresist, a green photoresist and a blue photoresist arranged sequentially on the substrate.

Wherein, the source electrode and the drain electrode are formed separately on the substrate by a same process, the channel is located between the source electrode and the drain electrode, and the channel connects with the source electrode and the drain electrode.

Wherein, the display panel further includes a black matrix, the black matrix is formed on the substrate, and the source electrode and the drain electrode are formed separately on the black matrix.

Wherein, the channel is disposed on the substrate, the source electrode and the drain electrode are located separately on the channel, and the channel connects with the source electrode and the drain electrode.

The beneficial effects of the present invention are: comparing with the conventional art, the manufacturing method for the display panel of the present invention includes steps of: providing a substrate; forming a source electrode, a drain electrode and a channel on the substrate; depositing a first insulation layer on the substrate; forming multiple color photoresists disposed at intervals on the first insulation layer, and the source electrode, the drain electrode and the channel are located between two adjacent color photoresists such that the gate electrode formed subsequently form a TFT unit; forming a gate electrode and a common electrode in a same process, wherein the gate electrode is located on the first insulation layer and between two adjacent color resists, the common electrode is located on the color resist; forming a second insulation layer on the gate electrode and the common electrode, and the second insulation layer has a through hole communicated with the source electrode; forming a pixel electrode on the second insulation layer, wherein the pixel electrode contacts with the source electrode through the through hole, a storage capacitor is formed between the pixel electrode and the common electrode, the pixel electrode and the common electrode are separated by the second insulation layer, and a thickness of the second insulation layer is less than a thickness of the color photoresist layer. Accordingly, a distance between electrode plates of the storage capacitor of the display panel manufactured by the manufacturing method of the present invention is decreased comparing to the conventional art such that the capacitance of the storage capacitor manufactured by the COA technology is larger in order to improve the current leakage problem of the pixel electrode and the display effect of the display panel.

DETAILED DESCRIPTION OF THE PREFERRED EMBODIMENT

Figure 2:
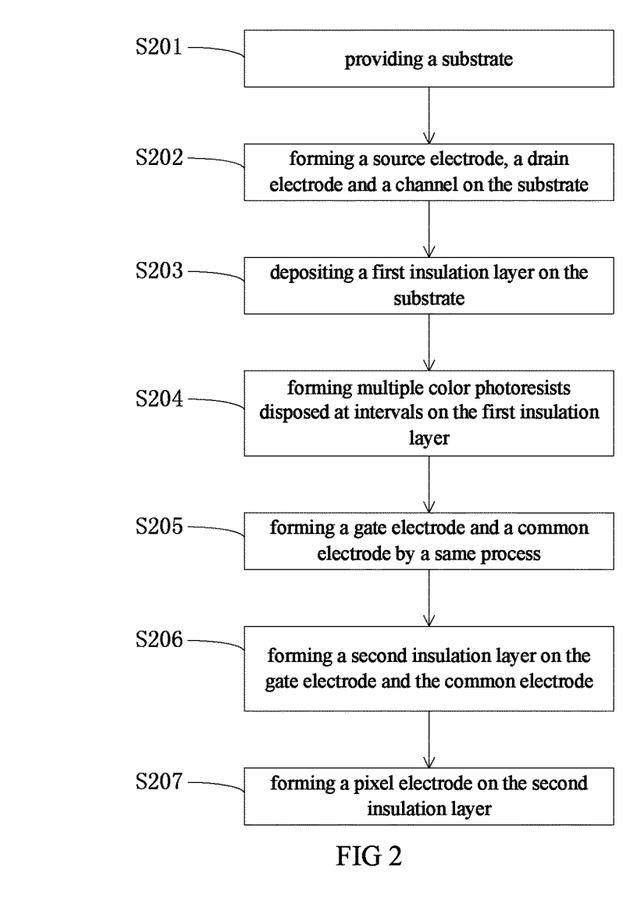
FIG. 2 is a flowchart of a manufacturing method for a display panel according to a first embodiment of the present invention.
Figure 3:
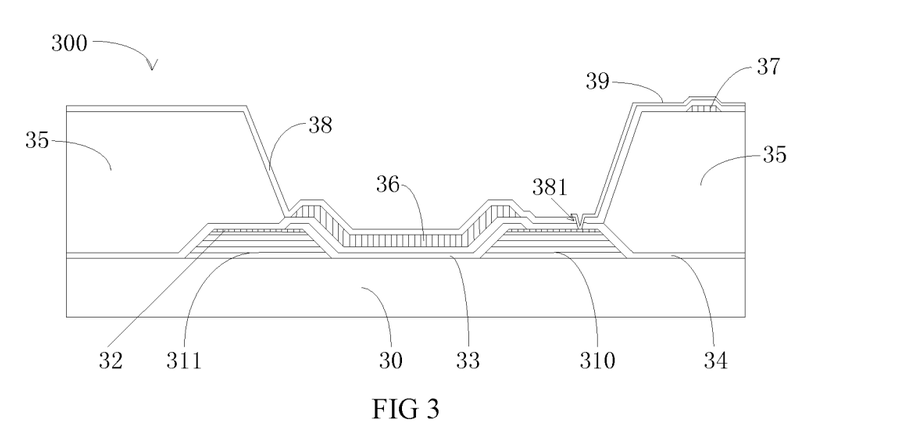
FIG. 3 is a schematic structure diagram of the display panel manufactured by the manufacturing method of the first embodiment shown in FIG. 2.

With reference to FIG. 2 and FIG. 3, FIG. 2 is a flowchart of a manufacturing method for a display panel according to a first embodiment of the present invention, and FIG. 3 is a schematic structure diagram of a display panel manufactured by the manufacturing method of the first embodiment shown in FIG. 2. The manufacturing method of the first embodiment manufactures a display panel 300, the first embodiment includes following steps.

S201: providing a substrate.

Generally, the substrate 30 is made of a transparent material such as glass.

S202: forming a source electrode, a drain electrode and a channel on the substrate.

Forming a source electrode 310, a drain electrode 311 and a channel 33 on the substrate. The source electrode 310 and the drain electrode 311 are conductive through the channel 33, and electron-hole pairs flow in the channel 33 in order to form a current.

In the present step S202, the channel 33 can be a layer closer to the substrate 30, or the source electrode 310 and the drain electrode 311 can be a layer closer to the substrate 30. The present embodiment selects the source electrode 310 and the drain electrode 311 as a layer that is closer to the substrate 30, that is, firstly, forming the source electrode 310 and the drain electrode 311 on the substrate 30.

Specifically, a step for forming the source electrode 310 and the drain electrode 311 is: depositing a metal layer, and the metal layer can be a Mo/Al composite material, a Mo/Cu composite material or another material according to the requirements such as conductivity of the manufacturing process; then performing a photomask process to the metal layer in order to form the source electrode 310 and the drain electrode 311. Because the source electrode 310 and the drain electrode 311 are extended along a same direction of the substrate, the source electrode 310 and the drain electrode 311 are formed by a same manufacturing process.

A step for forming a channel 33 is: firstly, forming a semiconductor layer, and the semiconductor layer is selected as a-Si:H, that is, hydrogenated amorphous silicon. Then performing a photomask process to the semiconductor layer in order to form the channel 33 between the source electrode 310 and the drain electrode 311, and the channel connects with the source electrode 310 and the drain electrode 311.

The channel 33 in the present embodiment is thinner comparing with respect to the channel 15 in FIG. 1. Because in FIG. 1, the channel 15 is formed in advance, then depositing a metal layer on the channel 15, finally, etching the metal layer in a photomask process. In order to make no residual in a spaced region between the source electrode/drain electrodes 16, it requires over etching the channel 15, that is, a portion of the channel 15 is required to be etched. If the channel is too thin after the over etching, some affection will generate for the conduction between the source electrode/drain electrode 16. Therefore, the channel in FIG. 1 requires a certain of thickness. However, on the present embodiment, the source electrode 310 and the drain electrode 311 are formed firstly, therefore, the present embodiment does not generate the problem in FIG. 1, and the channel can be thinner. The thinner channel 33 is beneficial to the deposition time of the semiconductor layer and improves the electrical properties at the same time.

The present embodiment utilizes ai-Si:H, that is hydrogenated amorphous silicon, which is more sensitive to a light, easily to generate electron-hole pairs by an affection of the light, generating a current under the function of external electric field and cause a current leakage. If the channel 33 is too thick, the current leakage is increased, and the electrical properties are poor. In the present embodiment, the channel 33 is thinner so as to reduce the affection of the light in order improve the current leakage situation and improve the electrical properties.

The source electrode 310 and the drain electrode 311 are conductive through the channel 33, and the source electrode 310 and the drain electrode 311 are required to be contacted with the channel 33. In order to decrease a contact resistance between the metal and the semiconductor layer, between the source electrode 310 and the channel 33 and between the drain electrode 311 and the channel 33, an ohmic contact layer 32 is provided. The ohmic contact layer 32 is a doped amorphous silicon thin film.

The deposition of the above metal layer adopts a sputter method in the physical vapor deposition. The sputter method utilizes a specific sputtering target as a material source, and using positive ions to bombard the target under the function of the electric field, atoms and molecules of the target which are moved out are deposited on a surface of the substrate in order to form the metal layer. The deposition speed is fast, and has a good binding property with the substrate 30. Because the material of the metal layer is easily to be manufactured as a target, in the present embodiment, using the sputter method to perform a deposition.

The deposition of the semiconductor layer adopts a PECVD method in the chemical vapor deposition. The PECVD method adopts microwave or radio frequency to ionize atomic gases of a semiconductor in order to form plasma partially. The chemical activity of the plasma is stronger so that it is easily to deposit and form a thin film. The method is suitable for a deposition of a non-metallic material.

The above photomask process specifically includes steps of photoresist coating, exposing, developing, etching, and photoresist removing and so on. For photomask processes for different materials, the difference is that the selection of the photoresist material in the photoresist coating process and the selection of the developer in the developing process. The photomask process adopts conventional means in this technology field, no more repeating.

S203: depositing a first insulation layer on the substrate.

The first insulation layer 34 is a TFT gate insulation layer. In order to ensure the electrical property of the TFT, the requirement for the first insulation layer is higher. Therefore, the present embodiment performs two deposition processes to obtain the first insulation layer 34, and selects silicon nitride as a material of the first insulation layer 34. The deposition method is PECVD. Firstly, performing a slow deposition process to obtain a thinner silicon nitride layer, a slow speed can form a better interface between the silicon nitride and the channel 33. A second fast deposition obtains a thicker silicon nitride layer in order to finish the first insulation layer 34.

S204: forming multiple color photoresists disposed at intervals on the first insulation layer.

The present embodiment utilizes a red-green-blue three primary colors to realize a display of one pixel point. The multiple color photoresists disposed at intervals in the step S204 includes a red color resist, a green color resist and a blue color resist, and on the substrate 30, the three photoresists are arranged in a sequence of the red color photoresist, the green color photoresist and the blue color photoresist. In another embodiment, another arrangement sequence can be adopted.

Because the red color photoresist, the blue color photoresist and the green color photoresists are formed by different materials, the present step S204 repeating a photomask process in three times to form the above three color photoresists.

After forming the color photoresists 35, a gate electrode 36 should be manufactured in order to form a TFT with the source electrode 310 and the drain electrode 311. Therefore, when forming the color photoresists 35 disposed at intervals in the photomask process, the source electrode 310, the drain electrode 311 and the channel 33 are located between two adjacent color photoresists 35.

S205: forming a gate electrode and a common electrode by a same process.

Because the gate electrode 36 and the common electrode 37 on the substrate 30 are extended along a same direction, and the materials of the gate electrode 36 and the common electrode 37 are the same so that the gate electrode 36 and the common electrode 37 are formed by a same manufacturing process. The formation method is the same as the source electrode 310 and the drain electrode 311, that is using the sputter method to deposit the metal layer, and the metal layer can be Mo/Al or Mo/Cu, and so on. Then, utilizing a photomask process to the metal layer in order to form the gate electrode 36 and the common electrode 37. Wherein, the gate electrode 36 is located on the first insulation layer 34 and between two adjacent color photoresists 35. The common electrode 37 is located on the color photoresist 35. After finishing the present step S205, the gate electrode 35, the source electrode 310, the drain electrode 311 and the channel 33 forms a TFT.

S206: forming a second insulation layer on the gate electrode and the common electrode.

The second insulation layer 38 formed in the present step S206 has a through hole 381 communicated with the source electrode 310. The present embodiment also utilizes a silicon nitride material having a better densification. Firstly, depositing a silicon nitride layer through PECVD method. Then, through a photomask process to form the through hole 381.

S207: forming a pixel electrode on the second insulation layer.

In the present embodiment, using a sputter method to deposit a conductive layer on the second insulation layer 38.

The conductive layer is ITO. Then through a photomask process to obtain a pixel electrode 39. The pixel electrode 39 contacts with the source electrode 310 through the through hole 381 such that an electric potential is transmitted to the pixel electrode 39. After finishing the step S207, a storage capacitor is formed between the pixel electrode 39 and the common electrode 37. The pixel electrode 39 and the common electrode 37 are separated by the second insulation layer 38. That is, a distance between electrode plates of the storage capacitor is smaller such that the capacitance of the storage capacitor is larger in order to improve the display effect of the display panel 300.

Figure 4:
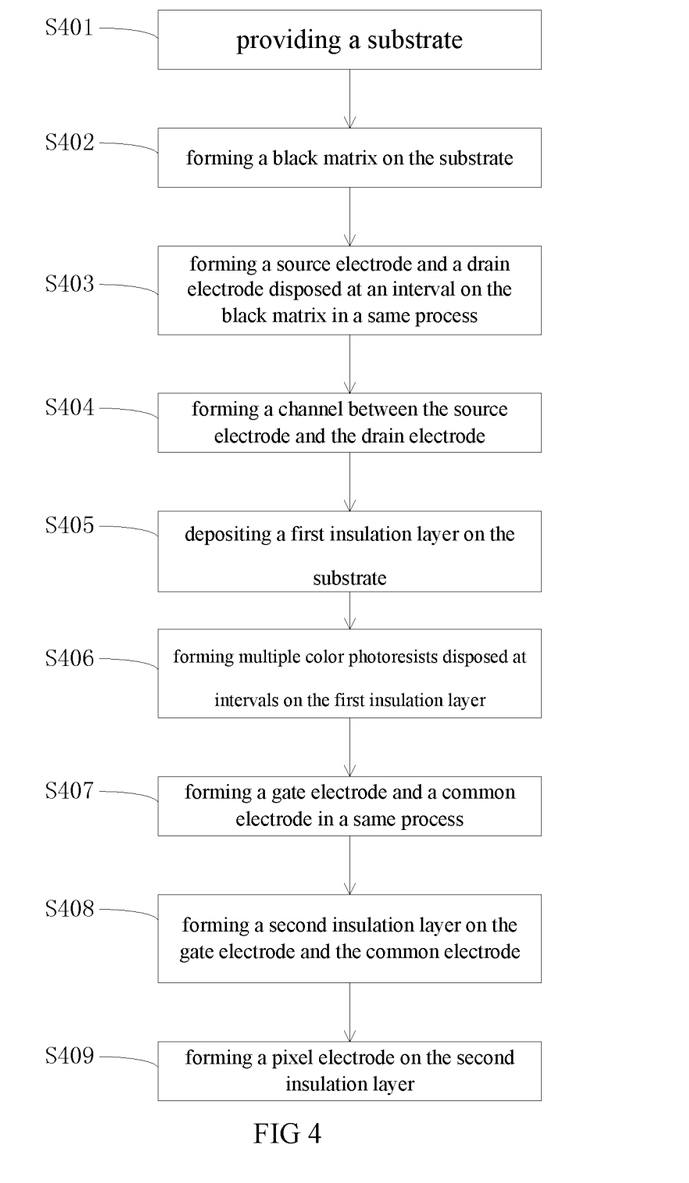
FIG. 4 is a flowchart of a manufacturing method for a display panel according to a second embodiment of the present invention.
Figure 5:
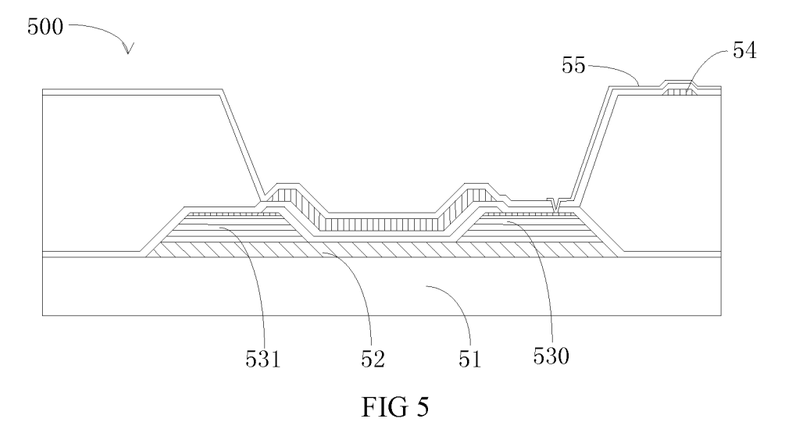
FIG. 5 is a schematic structure diagram of the display panel manufactured by the manufacturing method of the second embodiment shown in FIG. 4.

With reference to FIG. 4 and FIG. 5, and FIG. 4 is a flowchart of a manufacturing method for a display panel according to a second embodiment of the present invention; FIG. 5 is a schematic structure diagram of the display panel manufactured by the manufacturing method of the second embodiment shown in FIG. 4. The second embodiment of the manufacturing method obtains a display panel 500, and the second embodiment includes following steps:

S401: providing a substrate.

S402: forming a black matrix on the substrate.

S403: forming a source electrode and a drain electrode disposed at an interval on the black matrix in a same process.

S404: forming a channel between the source electrode and the drain electrode.

S405: depositing a first insulation layer on the substrate.

S406: forming multiple color photoresists disposed at intervals on the first insulation layer.

S407: forming a gate electrode and a common electrode in a same process.

S408: forming a second insulation layer on the gate electrode and the common electrode.

S409: forming a pixel electrode on the second insulation layer.

The difference between the second embodiment and the first embodiment is the step S402 and the step S403, the other steps are similar, for the same steps, no more repeating.

For the step S402, because in the first embodiment, the channel is formed between the source electrode 310 and the drain electrode 311, that is, the channel 33 located at a spaced portion of the source electrode 310 and the drain electrode 311 is directly formed on the substrate, and the substrate 30 is a transparent substrate. When the display panel is operating, lights generated by a backlight module will affect the channel. As illustrated in the step S202, a current leakage phenomenon will generate easily in order to affect electrical properties. Therefore, in the step S402 of the present embodiment, coating a black matrix 52 on the substrate 51 first in order to realize a light-shielding function. Then, respectively forming a source electrode 530 and a drain electrode 531.

For the step S403, forming the source electrode 530 and the drain electrode 531 disposed at an interval on the black matrix 52. Because an organic material that forms the black matrix 52 is easily to cause pollution to the source electrode 530 and the drain electrode 531 manufactured by a metal, between the black matrix 52 and the source electrode 530 and the drain electrode 531, an electrically insulating layer (not shown in the figure) is provided. The electrically insulating layer can select silicon oxide or silicon nitride. Because the densification of the silicon nitride is better, preferentially selecting the silicon nitride.

Figure 6:
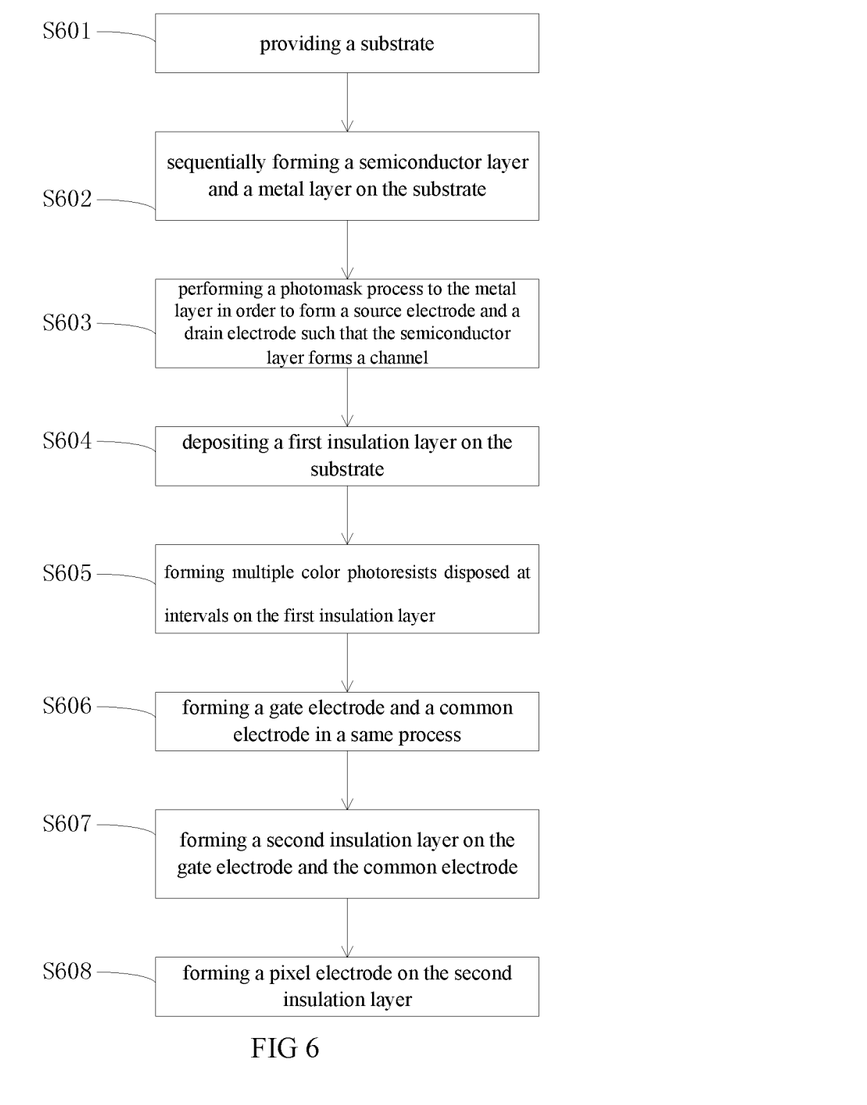
FIG. 6 is a flowchart of a manufacturing method for a display panel according to a third embodiment of the present invention.
Figure 7:
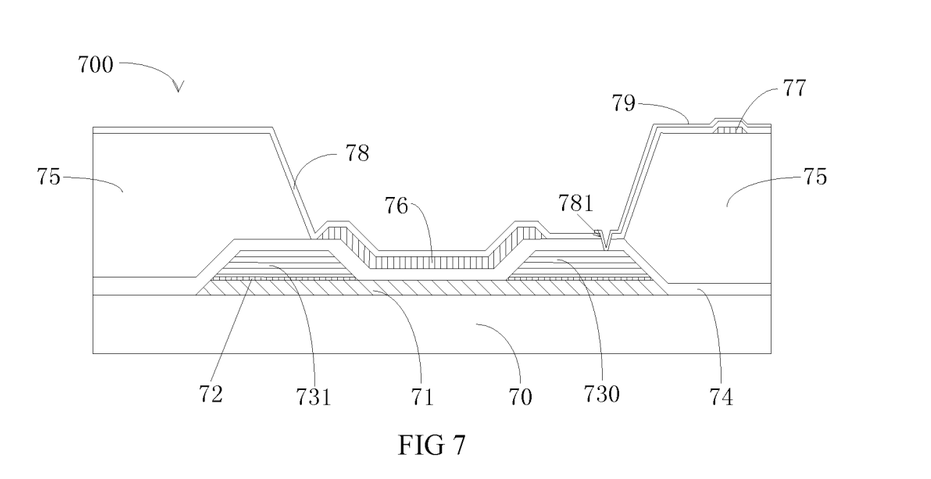
FIG. 7 is a schematic structure diagram of the display panel manufactured by the manufacturing method of the third embodiment shown in FIG. 6.

With reference to FIG. 6 and FIG. 7, and FIG. 6 is a flowchart of a manufacturing method for a display panel according to a third embodiment of the present invention; FIG. 7 is a schematic structure diagram of the display panel manufactured by the manufacturing method of the second embodiment shown in FIG. 6. The third embodiment of the manufacturing method obtains a display panel 700, and the third embodiment includes following steps S601: providing a substrate.

S602: sequentially forming a semiconductor layer and a metal layer on the substrate.

S603: performing a photomask process to the metal layer in order to form a source electrode and a drain electrode such that the semiconductor layer forms a channel.

S604: depositing a first insulation layer on the substrate.

S605: forming multiple color photoresists disposed at intervals on the first insulation layer.

S606: forming a gate electrode and a common electrode in a same process.

S607: forming a second insulation layer on the gate electrode and the common electrode.

S608: forming a pixel electrode on the second insulation layer.

The difference between the present embodiment and the first embodiment is the step S602 and the step S603, and the other similar steps are not repeated again.

The step S602 and the step 603 correspond to the step S202 in the first embodiment, and the present embodiment selects the channel 71 to be a layer that is closer to the substrate 70.

Specifically, firstly, sequentially forming a semiconductor layer and a metal layer on the substrate in the step S602. Then, in the step S603, through a photomask process to obtain the source electrode 730, the drain electrode 731 and the channel 71 at one time. The photomask in the photomask process is a special mask such as a Gray Tone Mask (GTM), a Half Tone Mask (HTM) or a Single Slit Mask (SSM). Therefore, the source electrode 730, the drain electrode 730 and the channel 71 can be formed at one time. Comparing with the first embodiment, one photomask process is reduced. After a developing process, through a wet etching process to etch the metal layer in order to form the source electrode 730 and the drain electrode 730, and through a dry etching to etch the semiconductor layer in order to obtain the channel 71.

Because in the present embodiment, the channel 71 is directly formed on the substrate 70, same as the second embodiment, a black matrix may be formed between the channel 71 and the substrate 70.

Comparing with the conventional art, the manufacturing method for the display panel of the present invention includes steps of: providing a substrate; forming a source electrode, a drain electrode and a channel on the substrate; depositing a first insulation layer on the substrate; forming multiple color photoresists disposed at intervals on the first insulation layer, and the source electrode, the drain electrode and the channel are located between two adjacent color photoresists such that the gate electrode formed subsequently form a TFT unit; forming a gate electrode and a common electrode in a same process, wherein the gate electrode is located on the first insulation layer and between two adjacent color resists, the common electrode is located on the color resist; forming a second insulation layer on the gate electrode and the common electrode, and the second insulation layer has a through hole communicated with the source electrode; forming a pixel electrode on the second insulation layer, wherein the pixel electrode contacts with the source electrode through the through hole, a storage capacitor is formed between the pixel electrode and the common electrode, the pixel electrode and the common electrode are separated by the second insulation layer, and a thickness of the second insulation layer is less than a thickness of the color photoresist layer. Accordingly, a distance between electrode plates of the storage capacitor of the display panel manufactured by the manufacturing method of the present invention is decreased comparing to the conventional art such that the capacitance of the storage capacitor is larger in order to improve the current leakage problem of the pixel electrode and the display effect of the display panel.

For the display panel of the present invention, three embodiments are provided for illustrating. Respectively referring to FIG. 3, FIG. 5 and FIG. 7, which respectively correspond to the first embodiment, the second embodiment and the third embodiment of the manufacturing method of the display described above.

In FIG. 3, the display panel 300 includes a substrate 300, a source electrode 310, a drain electrode 311, a channel 33, a first insulation layer 34, color photoresists 35, a gate electrode 36, a common electrode 37, a second insulation layer 38 and a pixel electrode 39.

Wherein, the source electrode 310 and the drain electrode 311 are disposed at an interval on the substrate 30. The channel 33 connects with the source electrode 310 and the drain electrode 311. The first insulation layer 34 is deposited on the substrate 30. Because the source electrode 310 and the drain electrode 311 requires to be contacted with the channel 33, and the source electrode 310 and the drain electrode 311 are metal materials, and the channel 33 is a semiconductor material, for decreasing a contact resistance between the metal and the semiconductor, a contact portions between the source electrode 310 and the channel 33 and between the drain electrode 311 and the channel 33 are provided with an ohmic contact layer 32. The ohmic contact layer 32 is a doped amorphous silicon thin film.

The multiple color photoresists 35 are disposed at intervals and formed on the first insulation layer 34. The color photoresists includes a red photoresist, a green photoresist and a blue photoresist arranged sequentially on the substrate.

The gate electrode 36 and the common electrode 37 are formed by a same process, the gate electrode 36 is located on the first insulation layer 34 and between two adjacent color photoresists 35, and the common electrode 37 is located on the color photoresist 35. The source electrode 310, the drain electrode 311 and the channel commonly formed a TFT, and the TFT is located between two adjacent color photoresists 35.

The second insulation layer 38 is formed on the gate electrode 36 and the common electrode 37, and the second insulation layer 38 has a through hole communicated with the source electrode 381. The pixel electrode 39 is formed on the second insulation layer 38, wherein the pixel electrode 39 further forms a storage capacitor with the common electrode 37. Therefore, a distance between electrode plates of the storage capacitor is smaller such that the capacitance of the storage capacitor is larger in order to improve the display effect of the display panel 300.

In FIG. 5, the display panel 500 is similar to the display panel 300. The display panel 500 also includes a substrate, a source electrode, a drain electrode, a channel, a first insulation layer, color photoresists, a gate electrode, a common electrode, a second insulation layer and a pixel electrode. The same portions are not repeated anymore.

The difference is that the display panel 500 further includes a black matrix 52. The black matrix 52 is formed on the substrate 51, and the source electrode 530 and the drain electrode 531 are formed separately on the black matrix 52. The specific function is described in the second embodiment of the manufacturing method for the display panel, no more repeating.

In FIG. 7, the display panel 700 is similar to the display panel 300. The display panel 700 also includes a substrate 70, a source electrode 730, a drain electrode 731, a channel 71, a first insulation layer 74, color photoresists 75, a gate electrode 76, a common electrode 77, a second insulation layer 78 and a pixel electrode 79.

In the display panel 700, between the source electrode 730 and the channel 71 and between the drain electrode 731 and the channel 71, an ohmic contact layer 72 is provided. The same portion of the display panel 700 and the display panel 300 are not repeated anymore. The difference is that a position relationship among the source electrode 730, the drain electrode 731, the channel 71 and the gate electrode 76.

Specifically, in the display panel 700, the channel 71 is formed on the substrate 70. The source electrode 730 and the drain electrode 731 are disposed at interval on the channel, and the channel is connected with the source electrode and the drain electrode.

Adopting the above structure, through one photomask process, the source electrode 730, the drain electrode 731 and the channel 71 are formed. Comparing with the display panel 300 and the display panel 500, one photomask process is reduced, the manufacturing processes are simplified.

Comparing with the conventional art, the pixel electrode and the common electrode are separated by the second insulation layer. That is, a distance between electrode plates of the storage capacitor is smaller such that the capacitance of the storage capacitor is larger in order to improve the display effect of the display panel.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A manufacturing method for a display panel, comprising steps of:
    providing a substrate, and forming a source electrode and a drain electrode disposed at an interval on the substrate by a same process;
    forming a channel between the source electrode and the drain electrode such that the channel connects with the source electrode and the drain electrode;
    depositing a first insulation layer on the substrate;
    forming multiple color photoresists including multiple red photoresists, green photoresists and blue photoresists disposed at intervals on the first insulation layer, and the source electrode, the drain electrode and the channel are located between two adjacent photoresists;
    forming a gate electrode and a common electrode by a same process such that the gate electrode is located on the first insulation layer and between two adjacent photoresists, and the common electrode is located on the multiple color photoresists;
    forming a second insulation layer on the gate electrode and the common electrode, and the second insulation layer has a through hole communicated with the source electrode; and
    forming a pixel electrode on the second insulation layer, wherein the pixel electrode contacts with the source electrode through the through hole, and a storage capacitor is formed between the pixel electrode and the common electrode.

2. The manufacturing method according to claim 1, wherein, before the step of forming a source electrode and a drain electrode disposed at an interval on the substrate by a same process, the method further includes a step of:

forming a black matrix on the substrate;

the step of forming a source electrode and a drain electrode disposed at an interval on the substrate by a same process further includes a step of:

forming the source electrode and the drain electrode disposed at an interval on the black matrix by the same process.

3. The manufacturing method according to claim 1, wherein, the step of forming a source electrode, a drain electrode and the channel further includes:

sequentially forming a semiconductor layer and a metal layer on the substrate;

performing a photomask process to the metal layer in order to form the source electrode and the drain electrode, and to the semiconductor layer in order to form the channel.

4. A manufacturing method for a display panel, comprising steps of:

providing a substrate, and forming a source electrode, a drain electrode and a channel on the substrate;

depositing a first insulation layer on the substrate;

forming multiple color photoresists disposed at intervals on the first insulation layer, and the source electrode, the drain electrode and the channel are located between two adjacent color photoresists;

forming a gate electrode and a common electrode by a same process such that the gate electrode is located on the first insulation layer, and the common electrode is located on the multiple color photoresists;

forming a second insulation layer on the gate electrode and the common electrode, and the second insulation layer has a through hole communicated with the source electrode; and forming a pixel electrode on the second insulation layer, wherein the pixel electrode contacts with the source electrode through the through hole, and a storage capacitor is formed between the pixel electrode and the common electrode.

5. The manufacturing method according to claim 4, wherein, the step of forming a source electrode, a drain electrode and a channel on the substrate further includes:

sequentially forming a semiconductor layer and a metal layer on the substrate; and performing a photomask process to the metal layer in order to form the source electrode and the drain electrode, and to the semiconductor layer in order to form the channel.

6. The manufacturing method according to claim 4, wherein, the step of forming a source electrode, a drain electrode and a channel on the substrate further includes:

forming the source electrode and the drain electrode disposed at an interval on the substrate by a same process;

forming the channel between the source electrode and the drain electrode such that the channel connects with the source electrode and the drain electrode.

7. The manufacturing method according to claim 6, wherein, before the step of forming the source electrode and the drain electrode disposed at an interval on the substrate by a same process further includes a step of:

forming a black matrix on the substrate;

the step of forming the source electrode and the drain electrode disposed at an interval on the substrate by a same process includes:

forming the source electrode and the drain electrode disposed at an interval on the black matrix by the same process.

* * * * *